United States Patent
Van Orden et al.

(10) Patent No.: US 9,116,293 B2
(45) Date of Patent: Aug. 25, 2015

(54) TUNABLE REFLECTORS BASED ON MULTI-CAVITY INTERFERENCE

(75) Inventors: Derek Van Orden, Albuquerque, NM (US); Amit Mizrahi, Albuquerque, MN (US); Timothy Creazzo, Albuquerque, NM (US); Stephen B. Krasulick, Albuquerque, NM (US)

(73) Assignee: Skorpios Technologies, Inc., Albuquerque, NM (US)

(*) Notice: Subject to any disclaimer, the term of this patent is extended or adjusted under 35 U.S.C. 154(b) by 416 days.

(21) Appl. No.: 13/608,920

(22) Filed: Sep. 10, 2012

(65) Prior Publication Data

US 2013/0243362 A1    Sep. 19, 2013

Related U.S. Application Data

(60) Provisional application No. 61/532,177, filed on Sep. 8, 2011, provisional application No. 61/613,446, filed on Mar. 20, 2012.

(51) Int. Cl.
| | |
|---|---|
| *G02B 6/26* | (2006.01) |
| *G02B 6/12* | (2006.01) |
| *G02F 1/225* | (2006.01) |
| *G02B 6/293* | (2006.01) |
| *H01S 3/063* | (2006.01) |
| *G02F 1/21* | (2006.01) |

(52) U.S. Cl.
CPC .............. *G02B 6/12007* (2013.01); *G02B 6/26* (2013.01); *G02F 1/225* (2013.01); *G02B 6/29359* (2013.01); *G02F 2001/213* (2013.01); *H01S 3/0637* (2013.01)

(58) Field of Classification Search
CPC .............. H01S 5/1071; G02B 6/29338; G02B 6/29389; G02F 2001/213
See application file for complete search history.

(56) References Cited

U.S. PATENT DOCUMENTS

| | | | | |
|---|---|---|---|---|
| 3,558,213 | A * | 1/1971 | Marcatili | 385/132 |
| 5,048,909 | A * | 9/1991 | Henry et al. | 385/27 |
| 5,195,161 | A | 3/1993 | Adar et al. | |

(Continued)

FOREIGN PATENT DOCUMENTS

WO    WO 2013/036955 A1    3/2013

OTHER PUBLICATIONS

Kazarinov et al., "Narrow-Band Resonant Optical Reflectors and Resonant Optical Transformers for Laser Stabilization and Wavelength Division Multiplexing", IEEE Journal of Quantum Electronics, vol. QE-23, No. 9, Sep. 1987.*

(Continued)

*Primary Examiner* — Michelle R Connelly
(74) *Attorney, Agent, or Firm* — Kilpatrick Townsend & Stockton LLP

(57) ABSTRACT

A reflective structure includes an input/output port and an optical splitter coupled to the input/output port. The optical splitter has a first branch and a second branch. The reflective structure also includes a first resonant cavity optically coupled to the first branch of the optical splitter. The first resonant cavity comprises a first set of reflectors and a first waveguide region disposed between the first set of reflectors. The reflective structures further includes a second resonant cavity optically coupled to the second branch of the optical splitter. The second resonant cavity comprises a second set of reflectors and a second waveguide region disposed between the second set of reflectors.

6 Claims, 14 Drawing Sheets

(56) References Cited

U.S. PATENT DOCUMENTS

| | | | |
|---|---|---|---|
| 5,469,460 A * | 11/1995 | Van Roijen et al. | 372/94 |
| 6,154,591 A | 11/2000 | Kershaw | |
| 2002/0141704 A1 | 10/2002 | Lim et al. | |
| 2003/0219045 A1 * | 11/2003 | Orenstein et al. | 372/20 |
| 2004/0141540 A1 | 7/2004 | Masood et al. | |
| 2009/0028567 A1 | 1/2009 | Socci et al. | |
| 2010/0085991 A1 * | 4/2010 | Okayama | 372/20 |
| 2010/0172610 A1 | 7/2010 | Gates et al. | |

OTHER PUBLICATIONS

Kazarinov, R. et al., "Narrow-Band Resonant Optical Reflectors and Resonant Optical Transformers for Laser Stabilization and Wavelength Division Multiplexing", IEEE Journal of Quantum Electronics, vol. 23, No. 9, pp. 1419-1425, Sep. 1987, [retrieved form URL: http://ieeexplore.ieee.org/stamp/stamp.jsp?tp=&arnumber=1073535&isnumber=23110], 7 pages.

Notification of Transmittal of the International Search Report and the Written Opinion of the International Searching Authority, or the Declaration; International Search Report and Written Opinion of the International Searching Authority for corresponding International Application No. PCT/US2012/054505 mailed on Dec. 17, 2012, 9 pages.

* cited by examiner

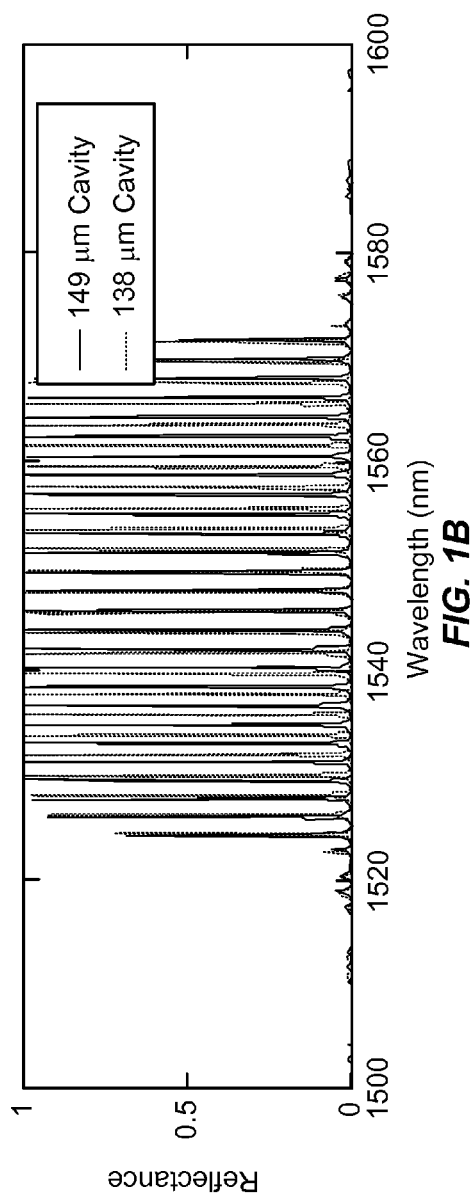
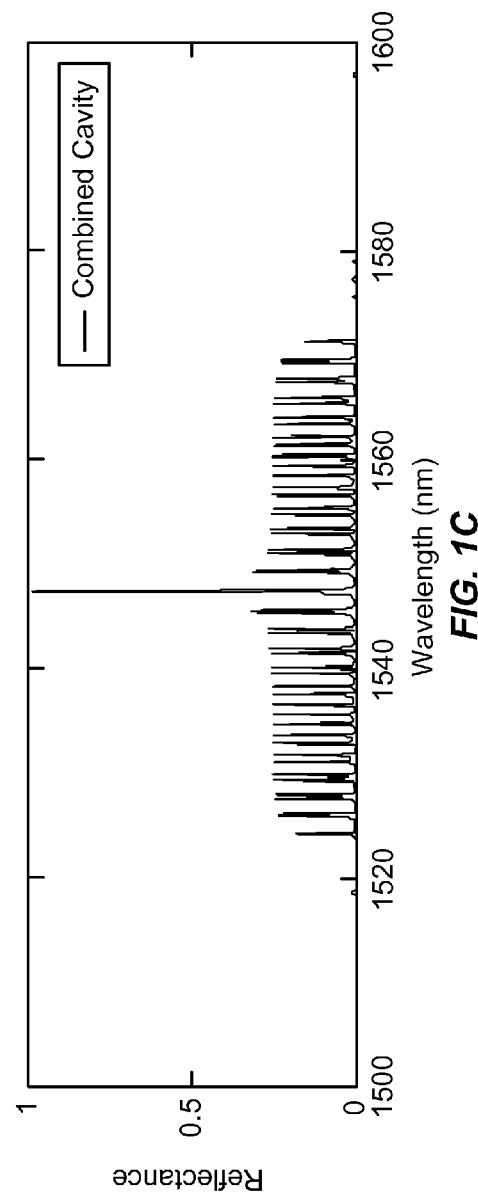
FIG. 1B
FIG. 1C

TUNABLE REFLECTORS BASED ON MULTI-CAVITY INTERFERENCE

CROSS-REFERENCES TO RELATED APPLICATIONS

This application claims priority to U.S. Provisional Patent Application No. 61/532,177, filed on Sep. 8, 2011, entitled "Tunable Multi-Interference Loop," and U.S. Provisional Patent Application No. 61/613,446, filed on Mar. 20, 2012, entitled "Reflection System including Y-Junction Cavities," the disclosures of which are hereby incorporated by reference in their entirety for all purposes.

BACKGROUND OF THE INVENTION

Silicon photonics is an emerging technology that enables integration of many optical components on a single chip. One of the sets of desirable elements provided by silicon photonics are tunable reflectors, which can be utilized as an enabling technology for a wide variety of applications, particularly for laser feedback.

Despite the progress made in silicon photonics, there is a need in the art for improved methods and systems related to tunable reflectors.

SUMMARY OF THE INVENTION

Embodiments of the present invention relate to optical systems. More particularly, embodiments of the present invention relate to tunable reflectors utilizing resonant cavities. As an example, some embodiments of the present invention relate to coupled Fabry-Perot cavities. Other embodiments relate to optical reflection systems utilizing Y-junction cavities. Various embodiments of the present invention relate to devices that can provide a predetermined reflection coefficient at a specific wavelength using the Vernier effect. Tunability is provided, enabling implementation in applications including reflectors for laser feedback.

According to an embodiment of the present invention, a reflective structure is provided. The reflective structure includes an input/output port and an optical splitter coupled to the input/output port. The optical splitter has a first branch and a second branch. The reflective structure also includes a first resonant cavity optically coupled to the first branch of the optical splitter. The first resonant cavity comprises a first set of reflectors and a first waveguide region disposed between the first set of reflectors. The reflective structure further includes a second resonant cavity optically coupled to the second branch of the optical splitter. The second resonant cavity comprises a second set of reflectors and a second waveguide region disposed between the second set of reflectors.

According to another embodiment of the present invention, a tunable reflector structure is provided. The tunable reflector includes an input/output port and an optical splitter coupled to the input/output port. The tunable reflector also includes a first resonant cavity coupled to a first output of the optical splitter and a second resonant cavity coupled to a second output of the optical splitter. At least one of the first resonant cavity or the second resonant cavity include a phase control element and the first resonant cavity and the second resonant cavity form a loop with the optical splitter.

According to an alternative embodiment of the present invention, a reflective structure is provided. The reflective structure includes an input/output port and a Y-junction waveguide optically coupled to the input/output port. The Y-junction waveguide includes a primary arm including a primary propagation section, a first primary reflector coupled to the primary propagation section, a primary Y-junction waveguide coupled to the primary propagation section, and a second primary reflector coupled to the primary Y-junction waveguide. The Y-junction waveguide also includes a secondary arm including a secondary propagation section, a first secondary reflector coupled to the secondary propagation section, a secondary Y-junction waveguide coupled to the secondary propagation section, and a second secondary reflector coupled to the secondary Y-junction waveguide.

According to an embodiment of the present invention, a reflective structure includes an input/output port and a Y-junction waveguide optically coupled to the input/output port. The Y-junction waveguide includes a primary arm including a primary propagation section, a first primary reflector coupled to the primary propagation section, a primary Y-junction waveguide coupled to the primary propagation section, and a second primary reflector coupled to the primary Y-junction waveguide. The Y-junction waveguide also includes a secondary arm including a secondary propagation section, a first secondary reflector coupled to the secondary propagation section, a secondary Y-junction waveguide coupled to the secondary propagation section, and a second secondary reflector coupled to the secondary Y-junction waveguide.

Numerous benefits are achieved by way of the present invention over conventional techniques. For example, embodiments of the present invention provide a compact tunable reflector, compatible with thin (e.g. ~200 nm) Silicon on Insulator (SOI), that may be tuned (e.g. thermally) with relatively low power. This is in contrast to binary superimposed grating that are typically very long and compatible with thick (e.g. 1.5 µm) silicon. Also, embodiments of the present invention provide an easier fabrication process than conventional techniques. These and other embodiments of the invention along with many of its advantages and features are described in more detail in conjunction with the text below and attached figures.

BRIEF DESCRIPTION OF THE DRAWINGS

FIG. 1B is a plot showing reflectance spectra for cavities of the tunable reflective structure illustrated in FIG. 1A;

FIG. 1C is a plot showing reflectance spectra for the tunable reflective structure illustrated in FIG. 1A;

DETAILED DESCRIPTION OF SPECIFIC EMBODIMENTS

Silicon photonics is an emerging technology that enables integration of many optical components on a single chip. Tunable reflectors are of high importance for such a technology for a wide variety of applications, and particularly for laser feedback. Having a hybrid system with an integrated laser on a silicon chip is helpful or essential for this technology to be useful. According to embodiments of the present invention, wavelength tunable reflective structures are provided that are suitable for integration with a silicon-on-insulator (SOI) platform.

Figure 1A:
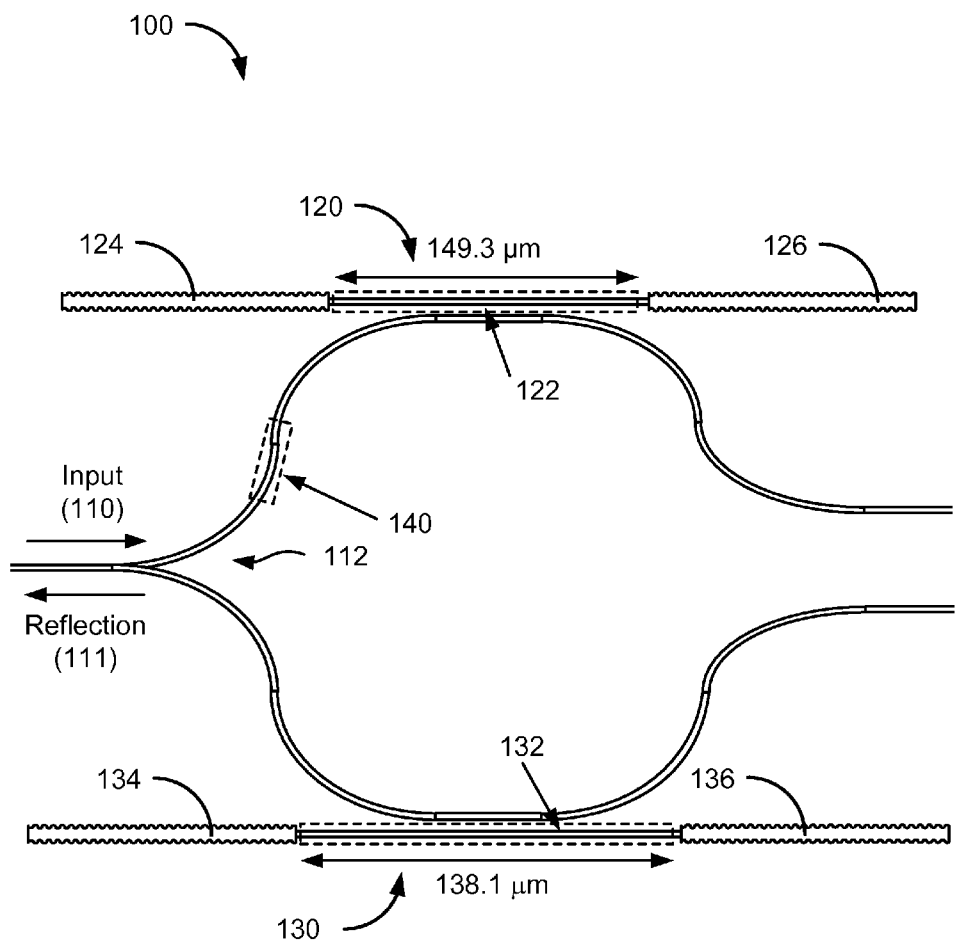
FIG. 1A is a simplified plan view of a tunable reflective structure according to an embodiment of the present invention.

FIG. 1A is a simplified plan view of a tunable reflective structure 100 according to an embodiment of the present invention. Referring to FIG. 1A, a first example configuration for a tunable reflector is provided. The input waveguide 110 is split by a Y-junction 112, with each branch of the Y-junction being incident on a side-coupled cavity, respectively. In other words, the input ports to each waveguide, which are side-coupled to cavities with different lengths, are combined using a Y-junction. As illustrated in FIG. 1A, first side-coupled cavity 120 is characterized by a central length of 149.3 µm and second side-coupled cavity 130 is characterized by a central length of 138.1 µm. First side-coupled cavity 120 includes mirrors 124 and 126, which can be distributed feedback (DFB) gratings, Bragg gratings, sidewall modulated waveguides, or other suitable reflectors. If periodic reflectors are used for these mirrors, strong reflection occurs at wavelengths within the stopband of the reflectors. Wavelengths outside this stopband will be transmitted through the reflectors, where the light may be scattered out using a suitable waveguide termination so as to avoid reflection.

Second side-coupled cavity 130 includes mirrors 134 and 136, which can be DFB gratings or other suitable reflectors. It should be noted that the embodiment of the present invention illustrated in FIG. 1A utilizes resonant cavities 120 and 130 coupled to the branches of the optical splitter 112 by directional couplers. Thus, this design differs from an optical splitter joined to DBR mirrors (or binary superimposed gratings), which, although they provide feedback based on Bragg reflections, are not resonant structures. The resonant structures described herein provide a reflectance spectra with a comb of frequencies associated with the free spectral range of the resonant cavity that differs from reflection from a grating structure.

When both cavities are resonant, strong reflection at the input 110 occurs, producing reflection 111. In the configuration illustrated in FIG. 1A, the coupling region from the input waveguide 110 to each of cavities 120 and 130 is aligned with the cavity center, although this is not required by the present invention.

A phase shifter 140 is provided in the waveguide disposed between the input waveguide 110 and the first side-coupled cavity 120. In some implementations, an additional phase shifter (not shown) is provided in the waveguide disposed between the input waveguide 110 and the second side-coupled cavity 130. Additionally, control over the index of refraction in the side-coupled cavities 120 and 130 is provided by the integration of phase control sections 122 and 132, respectively.

Referring once again to FIG. 1A, a set of Fabry-Perot cavity resonators are provided with a waveguide disposed between and terminated by reflectors. Branches (i.e., waveguides) extending from the Y-branch splitter are adjacent the cavity resonators and directional couplers are utilized to couple light from the branches to the Fabry-Perot cavities. These waveguides, which are evanescently side-coupled to the resonators by the directional couplers, respectively, will, at certain wavelengths, show resonant reflection from the cavity. These waveguides may be terminated such that light moving forward (away from the Y-junction) is scattered out. Such termination could be for example a taper or an inverse-taper of the waveguide.

In order to analyze device performance and functionality, a 3-dimensional model was used. In this model, the waveguides are 400 nm wide by 210 nm tall and are characterized by a refractive index of 3.48. These waveguides are placed in an ambient medium with a refractive index of 1.45. TE wave propagation is assumed. The waveguides support a single TE mode.

The reflectors are implemented using waveguides with an array of rectangular bumps with a period of 323 nm placed symmetrically on each side. The bumps are 283 nm wide by 210 nm tall by 142 nm deep. Each reflector is 27 µm long. The stop band of these reflectors extends from ~1525 nm to ~1575 nm. The cavity waveguides and bumps both have a refractive index of 3.48. For each cavity coupling region, the input waveguide and cavity waveguide are parallel for a length of 5 µm and spaced 320 nm edge-to-edge. The bends in the input waveguides have a radius of 7 µm. As discussed above, in a particular implementation, the waveguide sections for the two cavities have lengths of 149.3 µm and 138.1 µm, respectively. Utilizing phase control sections, the effective length of the cavities can be tuned as described more fully herein. The different sizes of the cavities provide different free spectral ranges as well as shifting of the resonance peaks, which enable reflection for a single peak when the cavities are combined using a Y-junction.

Figure 8A:
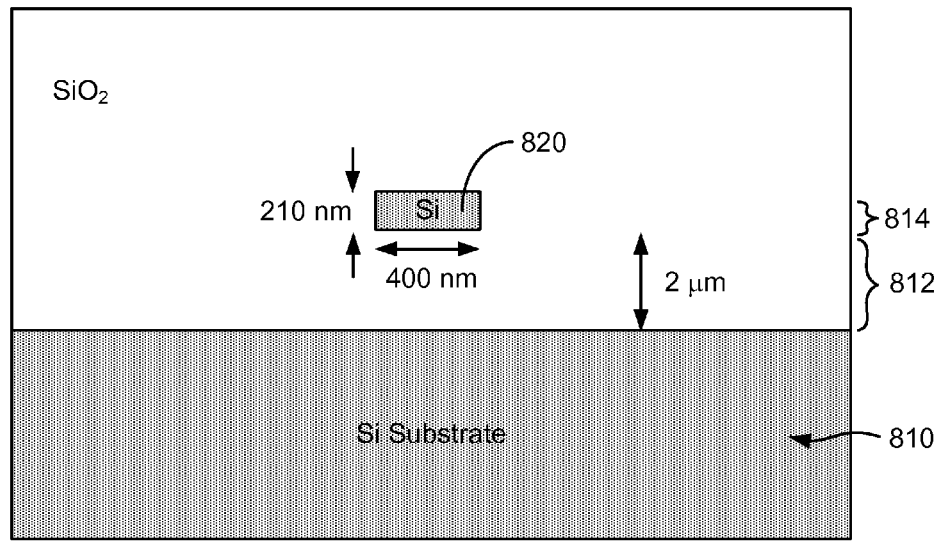
FIG. 8A is a cross-sectional diagram of a waveguide structure at a first position according to an embodiment of the present invention.

FIG. 8A is a cross-sectional diagram of the waveguide structure at input 110. As illustrated in FIG. 8A, the device structure can be fabricated on a silicon-on-insulator (SOI) platform including a silicon substrate 810, an insulator layer 812, and silicon layer (e.g., a single crystal silicon layer 814). In this embodiment, the buffered oxide layer 812 is 2 µm thick, but can vary in thickness from about 0.1 µm to about 50 µm. The silicon waveguide 820 along with other devices is etched from silicon layer 814. $SiO_2$ is then deposited via one or more methods such as PECVD, CVD, sputtering, SACVD, or the like. In the illustrated embodiment, the silicon layer has a thickness of 210 nm, but this value can range from about 50 nm to about 5,000 nm. The width of the waveguide is 400 nm in order to support single mode operation, but could be narrower or wider depending on the particular application.

Figure 8B:
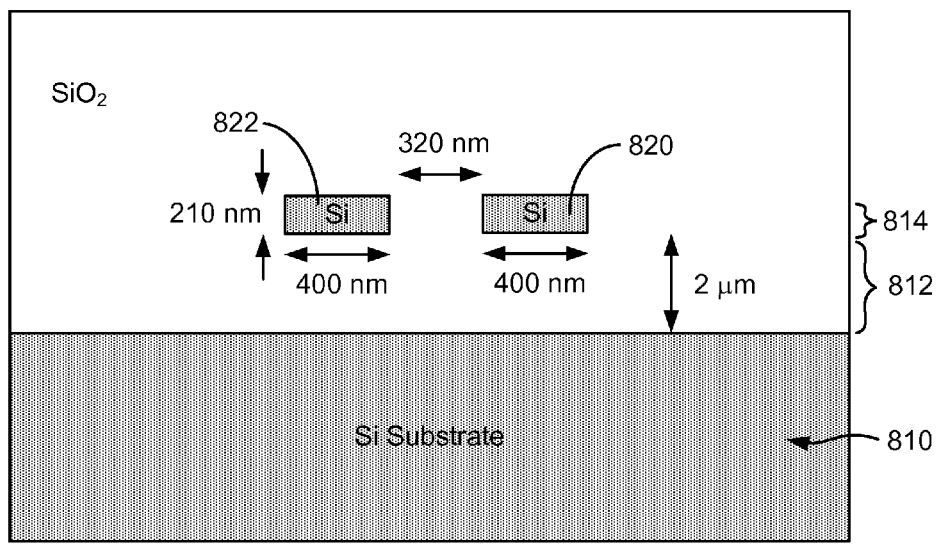
FIG. 8B is a cross-section diagram of a waveguide structure at a second position according to an embodiment of the present invention.

FIG. 8B is a cross-section diagram of a waveguide structure at coupling region 122. As illustrated in FIG. 8B, the fabrication on a silicon-on-insulator (SOI) platform is shown. The buffered oxide layer 812 is 2 µm thick as illustrated in FIG. 8A, but may vary as appropriate to the particular application. The waveguides are etched from silicon layer 814 and then $SiO_2$ is deposited via method such as PECVD, CVD, sputtering, SACVD, or the like. In the illustrated embodiment, the waveguide 820 is the extension of waveguide 820 illustrated in FIG. 8A. Waveguide 822, separated from waveguide 820 by 320 nm, is the waveguide disposed in the resonant cavity 120/130. The spacing between waveguides enables evanescent coupling and can vary from about 10 nm to about 5,000 nm depending on the coupling coefficient desired. Although the thicknesses of the waveguides in this region (i.e., 400 nm) are illustrated, this is not required and other thicknesses can be utilized. As an example, the waveguide thickness can vary as a function of length in the case of tapered waveguides.

FIG. 1B is a plot showing reflectance spectra for cavities of the tunable reflective structure illustrated in FIG. 1A and FIG. 1C is a plot showing reflectance spectra for the entire tunable reflective structure illustrated in FIG. 1A. The operation of the wavelength tunable reflectors based on the coupled cavity configuration illustrated in FIG. 1A is illustrated by FIGS. 1B and 1C. As shown in the figures, using the Vernier effect, the combined cavity structure exhibits a single, tunable reflectance peak at the input to the Y-junction. The reflectance spectra for the double side-coupled cavity reflector structures is illustrated, with the reflectance associated with the first side coupled cavity 120 being represented by a solid line and the reflectance associated with the second side coupled cavity 130 being represented by the dashed line. As will be evident to one of skill in the art, the differing cavity lengths will result in differing reflectance spectra. The reflectance spectrum for the combined cavities is illustrated in FIG. 1C, with a single spectral mode having high reflectance (e.g., approaching unity) and all remaining modes having low reflectance (e.g., less than 0.4). In some embodiments, multiple spectral modes are present in the spectra for the combined cavity, with the single mode shown in FIG. 1C providing particular benefits in some applications.

In the configuration illustrated in FIG. 1A, the coupling region of the side-coupled cavities is designed so that 13% of the power in the input waveguide couples to the cavity waveguide in a single pass. Weak coupling leads to a higher cavity quality factor and narrower reflection peaks. Of course, other coupling coefficients can be used. One of ordinary skill in the art would recognize many variations, modifications, and alternatives.

It should be noted that the evanescent side coupling illustrated in the side-coupled cavities 120 and 130 in FIG. 1 are not required by the present invention. As an alternative, a Y-junction splitter can be used to replace the illustrated evanescent side-coupling (illustrated in FIG. 4A). In this case, 50% of the power in the input waveguide couples to the cavity in a single pass in an embodiment. In other embodiments, the coupling coefficient can vary.

In order to tune the reflectance spectra of the individual cavities, and thereby, the combined cavity, a phase adjustment section 122 is provided for the first side-coupled cavity and a phase adjustment section 132 is provided for the second side-coupled cavity. In some embodiments, a separation is provided between the phase adjustment (i.e., phase control) sections and the reflectors to provide for temperature stabilization in the reflectors. Thus, in addition to variation in reflectance spectra as a result of the differing lengths, control can be exerted over the index of refraction in the waveguides, resulting in tuning of the reflectance spectra for the combined cavity. In some implementations, the index control is accomplished using thermal control, for example, by heating or cooling some or all of the central portion of the cavity structures, or alternatively heating up the whole cavity including the mirrors. In other implementations, carrier-based control is provided, for example, by integrating diode structures in conjunction with the waveguides. Additional description related to carrier-based control of index is provided in U.S. patent application Ser. No. 13/605,633, filed on Sep. 6, 2012, entitled "Tunable Hybrid Laser with Carrier-Induced Phase Control," the disclosure of which is hereby incorporated by reference in its entirety for all purposes.

Figure 1D:
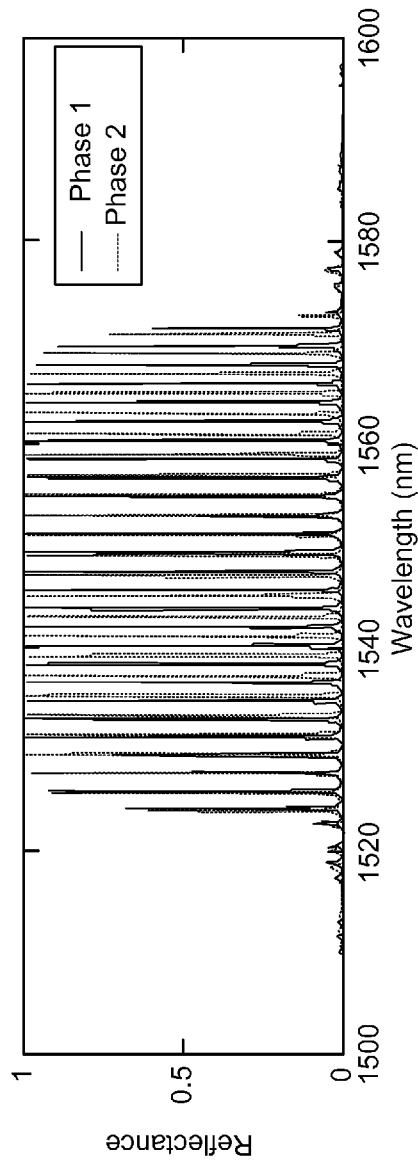
FIG. 1D is a plot showing spectral tuning of the reflectance spectra for cavities of the tunable reflective structure illustrated in FIG. 1A.
Figure 1E:
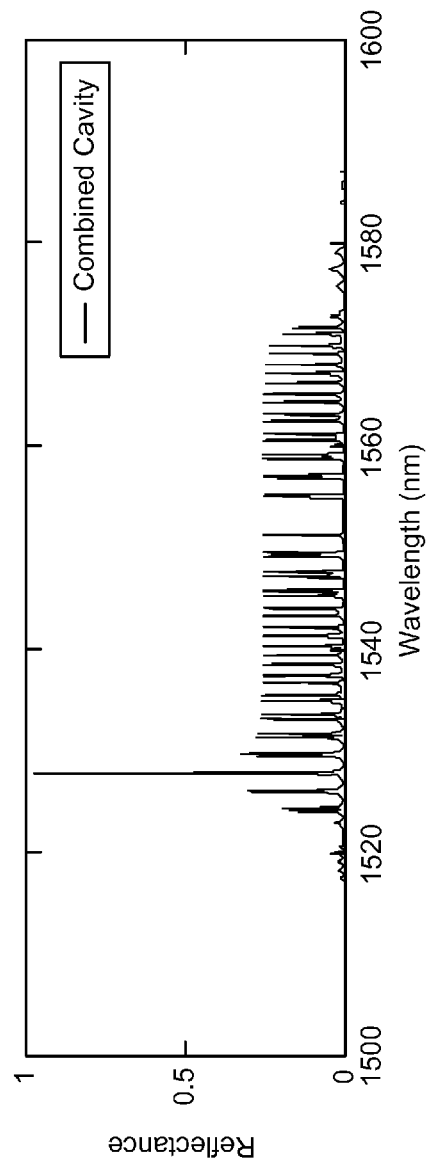
FIG. 1E is a plot showing spectral tuning of the reflectance spectra for the tunable reflective structure illustrated in FIG. 1A.

FIG. 1D is a plot showing spectral tuning of the reflectance spectra for cavities of the tunable reflective structure illustrated in FIG. 1A, and FIG. 1E is a plot showing tuning of the reflectance spectra for the entire tunable reflective structure illustrated in FIG. 1A. Referring to FIG. 1D, the response of the reflection spectrum for one of the side-coupled cavities is illustrated for a first phase condition (i.e., index of refraction of the waveguide region is a first value) and for a second phase condition (i.e., index of refraction of the waveguide region is a second, different value). The phase control can be implemented using either or both phase controller 122 or 132 as discussed above.

As the index of refraction associated with the cavity varies as a function of the phase control, the reflection spectra for the combined cavity also changes, with the single mode peak shifting to a different (higher or lower) wavelength in comparison with the wavelength of the response of the (a) the individual side-coupled cavities and (b) the entire structure shown in FIG. 1A. This shifts the spectrum so that the reflection at the input peaks at a new wavelength that is blue-shifted or red-shifted with respect to the original position of the peak, depending on the particular control algorithm. Thus, the peak can be scanned over a variety of wavelengths using embodiments of the present invention. Tuning is achieved by shifting the phase of the two cavities such that two peaks associated with the individual cavities overlap at a predetermined wavelength. Then fine tuning of the single peak can be achieved by changing the index of the two cavities together, thus moving the wavelength at which the peak occurs.

As shown in FIG. 1E, the wavelengths at which the peak reflectance occurs may be tuned by changing the refractive index of the cavity waveguides. This phase adjustment may be achieved by heating the waveguides, by using electro-optic devices, or by other suitable techniques. The phase of the reflection peaks from each side cavity depends on the cavity orientation and the order of the cavity resonance. As an example, if a cavity waveguide center is aligned with the center of the coupling region of the input waveguide, as shown in FIG. 1A, and the reflection is observed within the input waveguide at the coupling region center, then the reflection peaks will have phase mπ, where m is an integer denoting the order of the resonance.

In using the Vernier effect with the configuration illustrated in FIG. 1A, it may occur that both side cavities reflect strongly at a given wavelength, but with a phase difference of π. Therefore, phase shifter 140 is provided in one arm of the Y-branch. When phase shifter 140 turns on, a round-trip phase π is added to ensure proper matching at the Y-junction. In the case where the cavities reflect with the same phase, the phase shifter will be turned off.

Figure 2A:
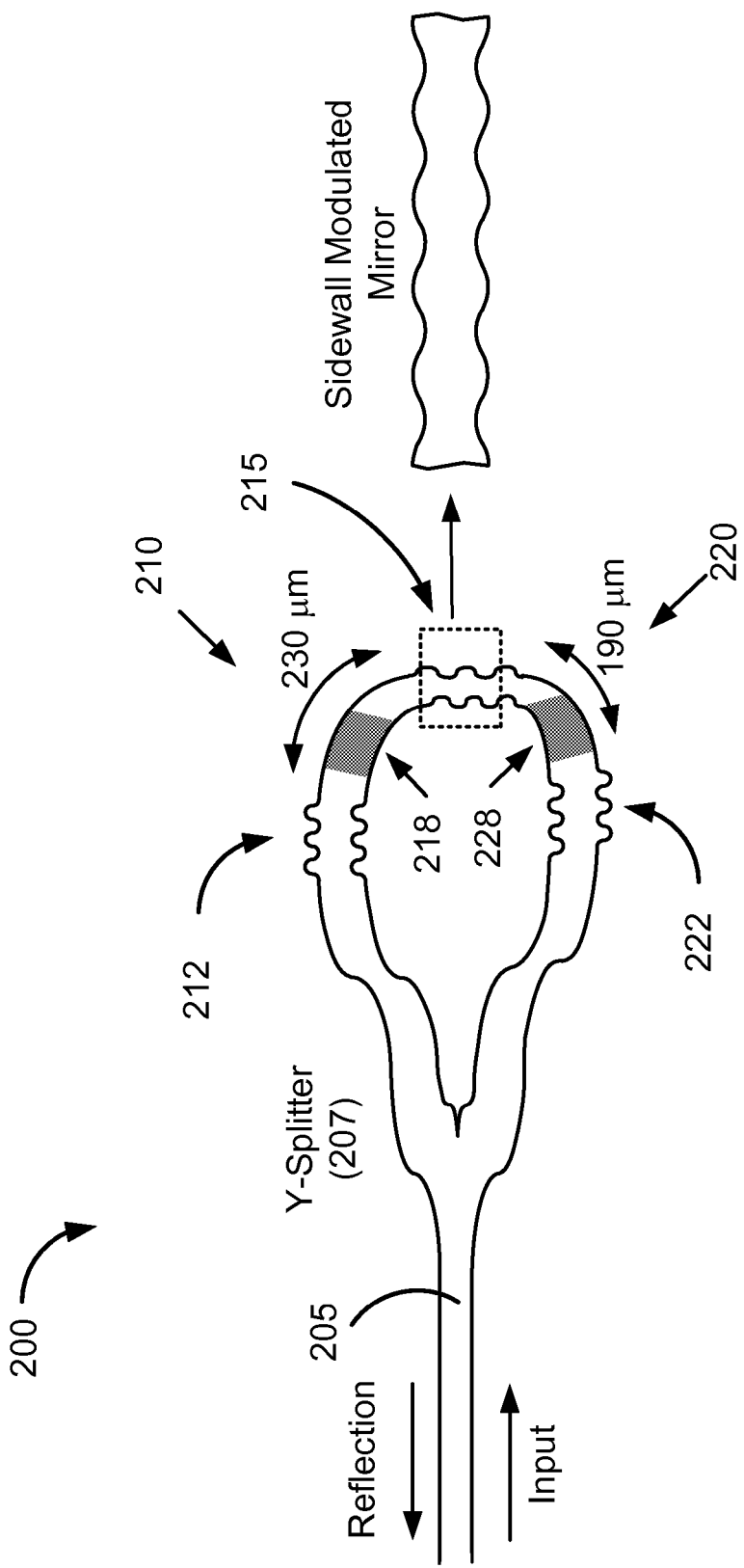
FIG. 2A is a simplified plan view of a tunable reflector according to an embodiment of the present invention.

FIG. 2A is a simplified plan view of a tunable reflector 200 according to an embodiment of the present invention. As illustrated in FIG. 2A, a double Fabry-Perot loop is provided that includes two Fabry-Perot cavities, FP cavity 210 and FP cavity 220. The cavities are formed using sidewall modulated mirrors in this embodiment as illustrated in the inset of FIG. 2A, but other reflective structures, including DFB grating structures, could be utilized to form the cavities. For the tunable reflector illustrated in FIG. 2A, the loop includes the two coupled Fabry-Perot cavities with partially transmitting mirrors. The loop is characterized by a high reflectance value at wavelengths for which both cavities are resonant.

An input is provided to the tunable reflector at input waveguide 205, which is coupled to Y-splitter 207. The branches splitting off from the Y-junction connect to form a loop. In some embodiments, the Y-junction coupler can be a multimode interference coupler, directional coupler, or other suitable splitter. Within the loop, three partially transmitting mirrors 212, 215, and 222 are placed, forming two coupled Fabry-Perot cavities with different lengths. In an embodiment, the lengths are 230 microns for FP cavity 210 and 190 μm for FP cavity 220, but these are just exemplary values and other lengths can be utilized, for example, lengths ranging from about 5 μm to about 1000 μm. In some embodiments, the center mirror 215 can be replaced by two mirrors, each associated with one of the FP cavities.

In an embodiment, the distances between the two outer mirrors and the Y-junction differ by a half effective wavelength with respect to the center wavelength of the operation band, or integer multiples of that difference. As a result, light reflected by the outer mirrors destructively interferes at the Y-junction and does not reflect back to the input. Using the Vernier effect, the combined cavity structure can exhibit a single reflectance peak when both cavities are resonant (i.e., fully transmitting).

In order to tune the reflectance peak, phase control sections 218 and 228 are provided in the waveguides of both FP cavities. It should be noted that in some embodiments, a single phase control section is utilized. The wavelengths at which peak reflection occurs may be tuned by changing the refractive index of the waveguides disposed between the mirrors, using the phase control sections 218 and 228. Phase control can be implemented by heating the waveguides, by using electro-optic devices, by carrier-induced index changes, or the like.

In summary, each Fabry-Perot resonator in the coupled system has a frequency comb associated with it and the waveguide sections control the free spectral range (FSR). When both elements are transmitting (i.e., at resonance in case of a Fabry-Perot cavity) the entire device is reflecting. The reflectance peaks are controlled by tuning the effective length of the FP cavities (e.g., by heating, current injection, or other mechanism to modify the optical path length), which changes the point of overlap of the 2 combs (i.e., the Vernier effect). Thus, embodiments of the present invention provide a tunable reflector that may be used for a compact feedback device for a laser (replacing, for example, grating reflectors). More than two cavities and combs can be used in other implementations.

As an alternative implementation, the FP cavities, each with two reflectors, can be replaced by Mach-Zehnder interferometers (MZI). In this implementation, similar concepts are applicable, but the interference element is different (i.e., MZI instead of Fabry-Perot). Each MZI creates a wavelength comb and both MZIs can be tuned for wavelength selection using the Vernier effect. Creating the combs with MZIs could be accomplished by making the arms with different lengths. The interfering elements can be different in other implementations, the lengths of the arms can be different, the splitting can be done in several ways, and there can be a total of one or more interfering elements.

Figure 2B:
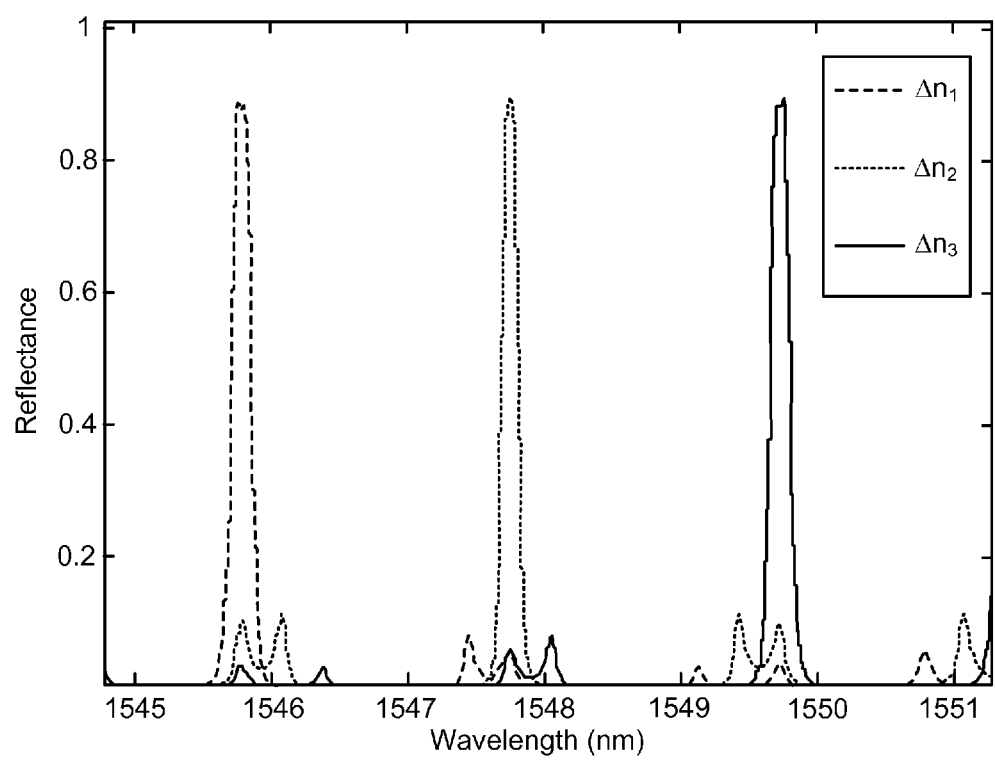
FIG. 2B is a plot showing reflectance spectra as a function of index shift for the tunable reflector illustrated in FIG. 2A.

FIG. 2B is a plot showing reflectance spectra as a function of index shift for the tunable reflector illustrated in FIG. 2A, demonstrating the device functionality. The plot illustrated in FIG. 2B was generated for 300 nm wide waveguides with a refractive index of 2.62 disposed in an ambient medium with a refractive index of 1.45. TM wave propagation is assumed. The waveguides support a single TM mode. This corresponds to effective index method representation of a three dimensional system with a TE mode.

The reflectors 212, 215, and 222 are implemented using waveguides with a sinusoidal modulation of the waveguide width (i.e., sidewall modulated mirrors or modulated waveguide structures). They have a refractive index of 2.62. The modulation amplitude is 30 nm on each side, and the modulation period is 416 nm. The outer reflectors 212 and 222 are each 50 μm long and the center reflector 215 is 100 μm long. The stopband of these reflectors extends from ~1544 nm to ~1551.5 nm. The distance between reflectors for the first cavity is 190 μm and is 230 μm for the second cavity. The Y-junction splitters are made of circular waveguide sections of inner and outer radii of 14.7 μm and 15 μm, respectively. These values are merely exemplary and the present invention is not limited to these particular values. As examples, the modulation amplitude can vary from about 5 nm to about 150 nm. The length of the outer reflectors can vary from about 5 μm to about 1,000 μm. The length of the center reflector can vary from about 5 μm to about 1,000 μm. One of ordinary skill in the art would recognize many variations, modifications, and alternatives.

Referring to FIG. 2B, reflectance values for three different phase control values for phase control section 218 are illustrated. For the first difference in index change in the 230 μm long cavity, the single reflectance peak is positioned at ~1546 nm, for the second change in index, the single reflectance peak is positioned at ~1548 nm, and for the third change in index, the single reflectance peak is positioned at ~1550 nm. Of course, depending on the particular index difference produced by the phase control sections, the reflectance peak will shift in wavelength. In other embodiments, the phase control section 222, or both phase control sections can be utilized to produce the wavelength tuning.

Figure 2C:
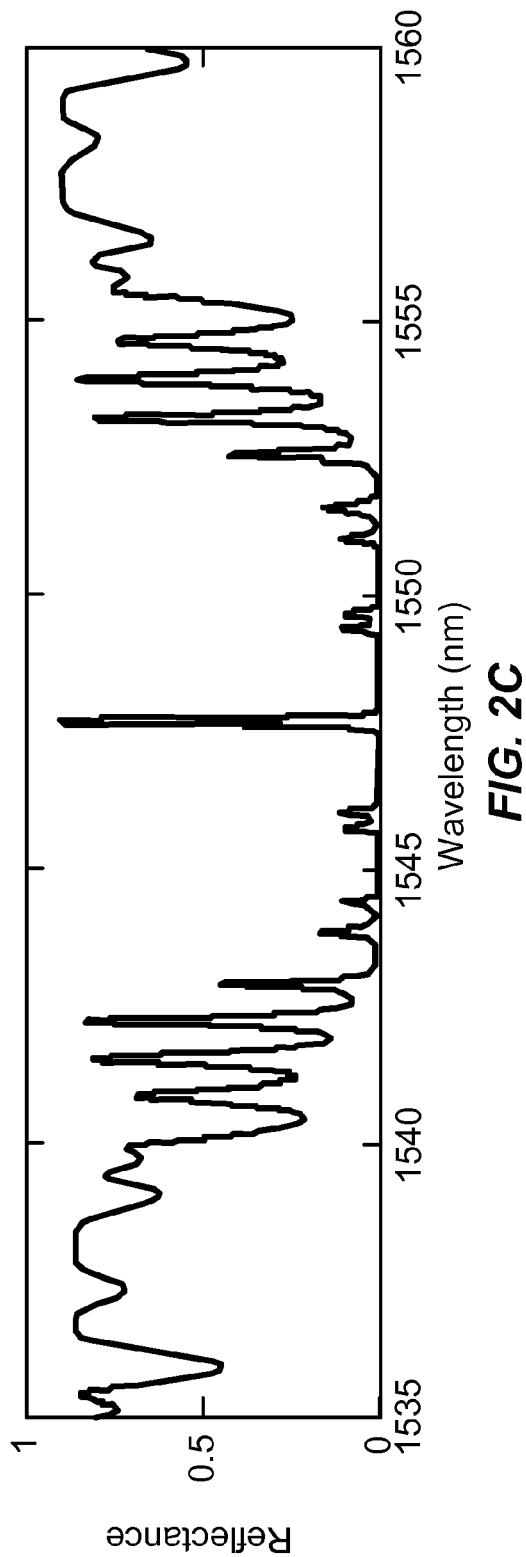
FIG. 2C is a plot showing reflectance spectra over a second range for the tunable reflective structure illustrated in FIG. 2A.

FIG. 2C is a plot showing reflectance spectra over a second range for the tunable reflective structure illustrated in FIG. 2A. As illustrated in FIG. 2C, the Fabry-Perot loop exhibits a strong reflectance value outside the stopband of the reflectors. As discussed more fully in relation to FIG. 3A, the addition of a Y-branch terminated with a reflector can reduce these reflections outside the stopband of the reflectors.

Figure 3A:
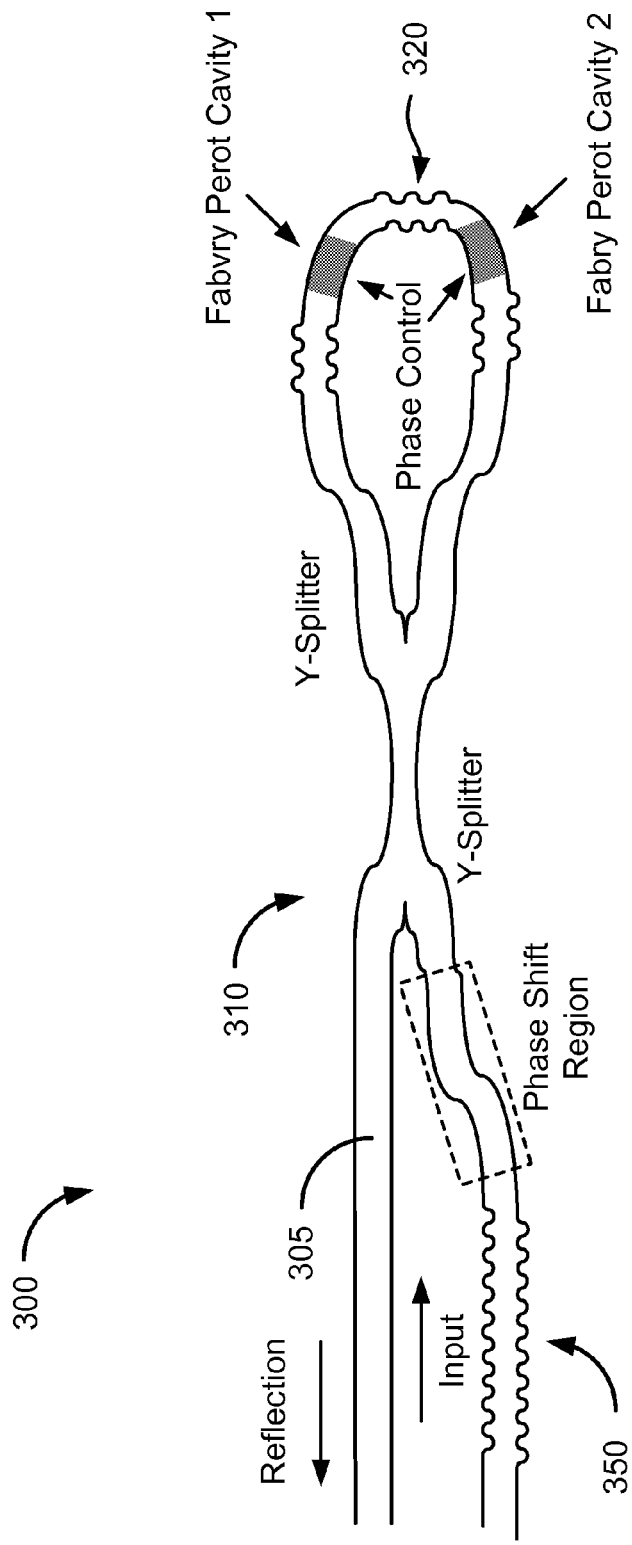
FIG. 3A is a simplified plan view of a tunable reflector according to an alternative embodiment of the present invention.

FIG. 3A is a simplified plan view of a tunable reflector 300 according to an alternative embodiment of the present invention. As illustrated in FIG. 3A, a double Fabry-Perot loop is formed within a Y-junction cavity, providing another configuration for a tunable reflector. Strong reflection occurs for wavelengths within the stopband of the grating reflector 350 on the bottom left portion of the device. In this embodiment, the Fabry-Perot loop forms one end of a cavity, while a reflector 350 is placed at the other end of the cavity. The input waveguide 305 is coupled to this cavity with a Y-junction 310, although the coupling may be realized using a directional coupler, MMI, or other suitable coupler. Strong reflection at the input waveguide occurs when the double FP loop 320 is resonant within the stopband of reflector 350. In order to provide tunability, a phase shift element, such as a heater or electro-optic device, is placed in the Y-junction cavity to ensure the resonant condition is met when strong reflectance is desired. The reflector 350 terminating the reflecting branch of the Y-junction has a finite stopband, so the device can exhibit strong reflectance for wavelengths within this stopband. The reflector 350 can be fabricated using a periodic grating or other suitable reflective structure.

In comparison with the FP loop illustrated in FIG. 2A, the embodiment illustrated in FIG. 3A provides strong reflection into the input at a tunable single peak, with a reduced reflection outside the stopband. This is useful, for example, in laser feedback applications and in systems in which lasing is desired only inside a narrow wavelength range.

Figure 3B:
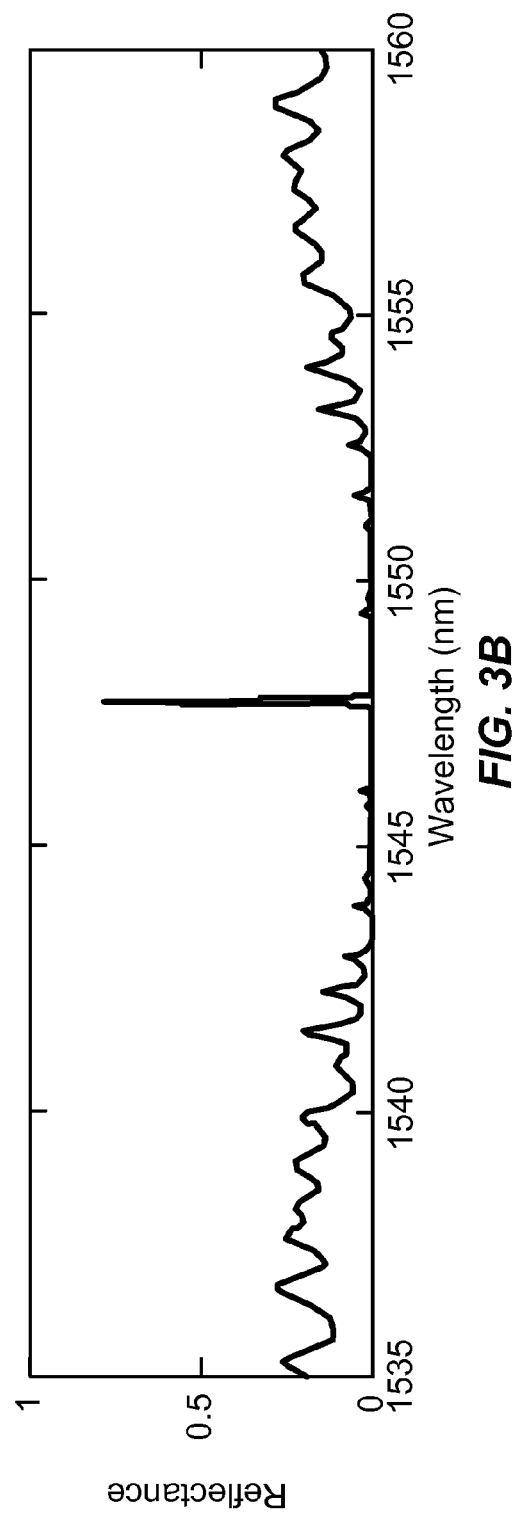
FIG. 3B is a plot showing reflectance spectra for the tunable reflector illustrated in FIG. 3A.

FIG. 3B is a plot showing reflectance spectra for the tunable reflector illustrated in FIG. 3A. As shown in FIG. 3B, reflections outside the reflector stopband are reduced in comparison with the reflectance spectra shown in FIG. 2C.

In computing the reflectance spectra shown in FIG. 3B, the model utilized for the structure shown in FIG. 2A was modified so the output of the Fabry-Perot Loop 320 connects to a Y-junction 310. One branch of the Y-junction is a 52 µm long waveguide terminated by a 200 µm long grating reflector 350. The reflector can be a sidewall modulated waveguide similar to those used in the Fabry-Perot Loop. Other reflective structures can also be utilized. The second branch of the Y-junction is the input waveguide 305. As discussed above, because the response outside the mirror stopband is suppressed, this device is suitable for use in a variety of applications including tunable filters for communication and for laser feedback.

Figure 5:
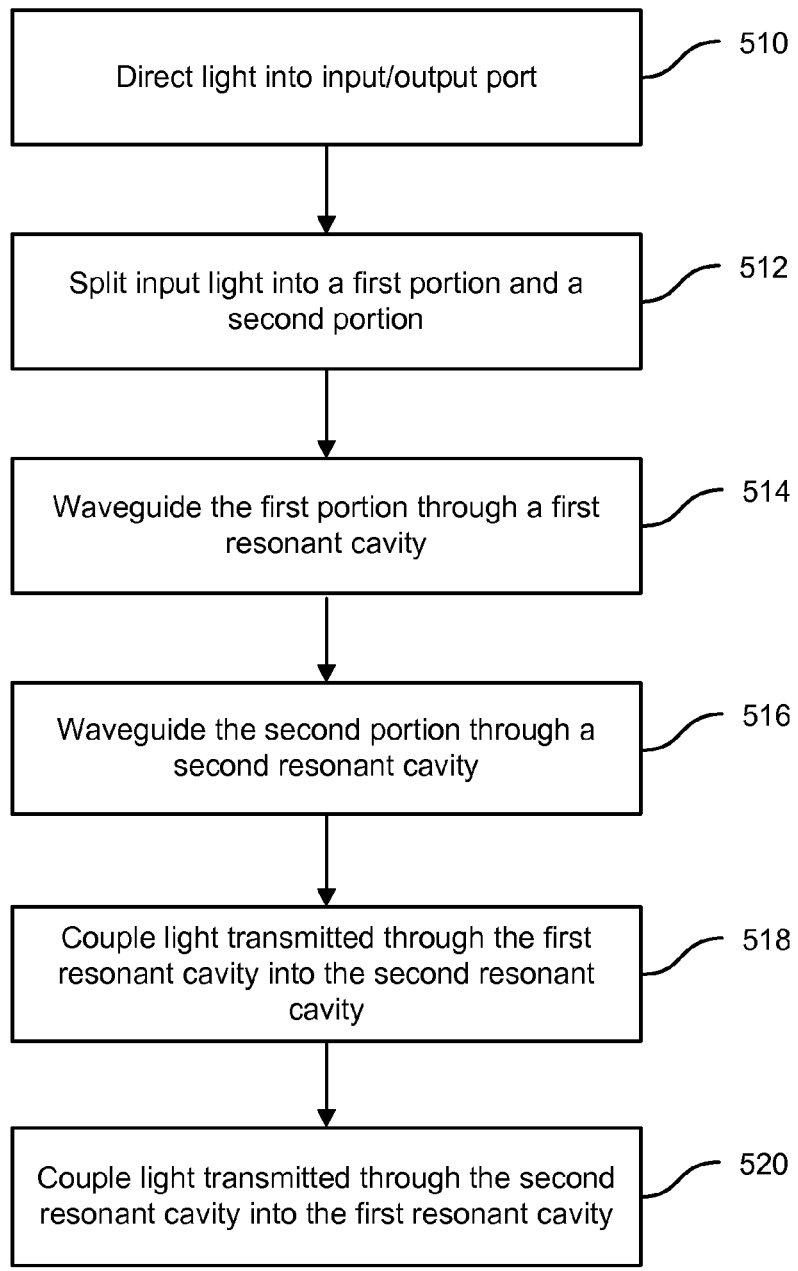
FIG. 5 is a simplified flowchart illustrating a method of operating a tunable reflector according to an embodiment of the present invention.

FIG. 5 is a simplified flowchart illustrating a method of operating a tunable reflector according to an embodiment of the present invention. The method includes directing light into an input/output port to provide input light (510) and splitting the input light into a first portion and a second portion (512). The method also includes waveguiding the first portion of the input light through a first resonant cavity (514) and waveguiding the second portion of the input light through a second resonant cavity (516). As an example, the resonant cavities can be Fabry-Perot cavities with sidewall modulated mirrors or grating reflectors. The method further includes coupling light transmitted through the first resonant cavity into the second resonant cavity (518) and coupling light transmitted through the second resonant cavity into the first resonant cavity (520). The loop structure provided by embodiments of the present invention enables the production of high reflectance at wavelengths for which both cavities are resonant. It should be understood that in embodiments in which a single common mirror is used, for example, mirror 215 in FIG. 2A, waveguiding a portion of the light through the first cavity and then coupling light transmitted through the first cavity into the second cavity is a process that occurs concurrently as light exiting mirror 215 from one of the cavities is, as a result of the geometry of the structure, coupled into the other cavity.

In an embodiment, at least one of the first resonant cavity or the second resonant cavity includes a phase control element such as a heater or a carrier-based (e.g., current injection) device that can vary the index of refraction of the waveguide, enabling the ability to control the reflectance spectrum of the device. Splitting the input light can include the use of an optical splitter coupled to the input/output port, for example, a directional coupler, a Y-branch splitter, a multimode interference (MMI) coupler, or the like. In some embodiments, the first resonant cavity and the second resonant cavity share a common reflector, whereas in other embodiments, the resonant cavities utilize independent reflectors, such as grating reflectors. As an example, the first resonant cavity and the second resonant cavity can utilize sidewall modulated waveguide reflectors. The cavity length of the first resonant cavity can differ from a cavity length of the second resonant cavity. Coupling into the cavities can also be accomplished with either Y-junctions, directional couplers, MMIs, or the like.

It should be appreciated that the specific steps illustrated in FIG. 5 provide a particular method of operating a tunable reflector according to an embodiment of the present invention. Other sequences of steps may also be performed according to alternative embodiments. For example, alternative embodiments of the present invention may perform the steps outlined above in a different order. Moreover, the individual steps illustrated in FIG. 5 may include multiple sub-steps that may be performed in various sequences as appropriate to the individual step. Furthermore, additional steps may be added or removed depending on the particular applications. One of ordinary skill in the art would recognize many variations, modifications, and alternatives.

In an alternative embodiment to that illustrated in FIG. 1A, the Y-junction splitters may be replaced by waveguide directional couplers with a predetermined splitting ratio to achieve a similar or identical functionality. The coupling into the branches of the splitter may be equal or may not be equal and, accordingly, unequal power may be transmitted into the branches. As described herein, reflectors may include grating structures, such as sidewall modulated waveguides, or other suitable reflective structures. If periodic grating reflectors are used, significant reflection occurs only at wavelengths within the grating stopband. Wavelengths outside this stopband will be transmitted through the gratings, where light may be scattered out using a suitable waveguide termination so as to avoid reflection.

Figure 4A:
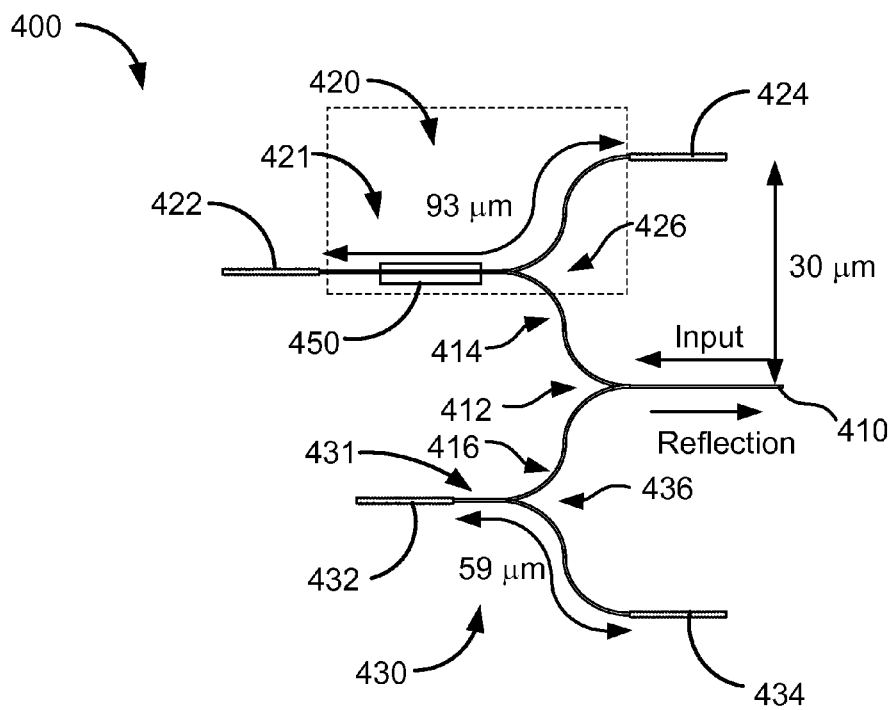
FIG. 4A is a simplified plan view of a multi-cavity reflector according to an embodiment of the present invention.

FIG. 4A is a simplified plan view of a multi-cavity reflector 400 according to an embodiment of the present invention. As illustrated in FIG. 4A, two Y-junction cavities are utilized, each having a distinct free spectral range. The combination of the two Y-junction cavities produces a single reflectance peak. As discussed with the other implementations, tuning of the cavities can be performed to tune the wavelength of the reflectance peak.

In the illustrated embodiment, the input is provided at waveguide 410. The top cavity 420 includes two reflectors 422 and 424, separated by a distance of 93 µm. Of course, this distance is merely exemplary and the distance between the reflectors can range from about 10 µm to about 1,000 µm, for example, 153 µm. The reflectors 422 and 424 can be grating structures, sidewall modulated waveguides, or the like. In the illustrated embodiment, the lateral spacing between reflector 424 and the input waveguide is 30 µm although this can vary as well. The top cavity 420 is coupled to the input by a primary arm 414 that is coupled to a primary propagation section 421 disposed between reflector 422 (a first primary reflector coupled to the primary propagation section) and reflector 424 (a second primary reflector). The primary propagation section 421 is coupled to reflector 424 using a primary Y-junction waveguide 426 coupled to the primary propagation section 421. The primary Y-junction 426 is disposed at the half-way point between the reflectors 422 and 424. This position is exemplary and the Y-junction 426 may meet the primary propagation section 421 at any suitable point. Reflector 422 is also coupled to the primary Y-junction waveguide 426.

The bottom cavity 430 includes two reflectors 432 and 434, separated by a distance of 59 µm. Of course, this distance is merely exemplary and the distance between the reflectors can range from about 10 μm to about 1,000 μm, for example, 93 μm. The reflectors 432 and 434 can be grating structures, sidewall modulated waveguides, or the like. In the illustrated embodiment, the lateral spacing between reflector 434 and the input waveguide is 30 μm although this can vary as well. As discussed in relation to the top cavity, the bottom cavity 430 is coupled to the input/output by a secondary arm 416 and includes a secondary propagation section 431, a first secondary reflector 432 coupled to the secondary propagation section 431, a secondary Y-junction waveguide 436 coupled to the secondary propagation section 431, and a second secondary reflector 434 coupled to the secondary Y-junction waveguide 436. The secondary Y-junction 436 is disposed at the half-way point between the reflectors 432 and 434. This position is exemplary and the Y-junction 436 may meet the secondary propagation section 431 at any suitable point.

Referring to FIG. 4A, light enters the reflective structure at the input 410 and is split by the coupler 412 (e.g., a Y-junction, a 3 dB coupler, an MMI, or the like) and passes to reflectors 422 and 432. Light reflected by reflector 422 propagates to reflector 424 and is reflected to reflector 422. Light reflected by reflector 432 propagates to reflector 434 and is reflected to reflector 432. In some embodiments, suitable phase adjustments are provided using phase control section 450 to introduce a variable index of refraction in a predetermined region as appropriate in conjunction with the coupler.

After the second reflection from reflectors 422 and 432, the reflected light propagates through the Y-junction 412 as illustrated along the reflection direction in the figure. As discussed below, changing the refractive index in one or more of the legs of the device results in a shift in the combined reflectance from ~1545.5 nm to ~1548 nm. As will be evident to one of ordinary skill in the art, multiple reflections can occur between the illustrated reflectors and the discussion provided above, is merely provided to illustrate the optical propagation path.

Figure 4B:
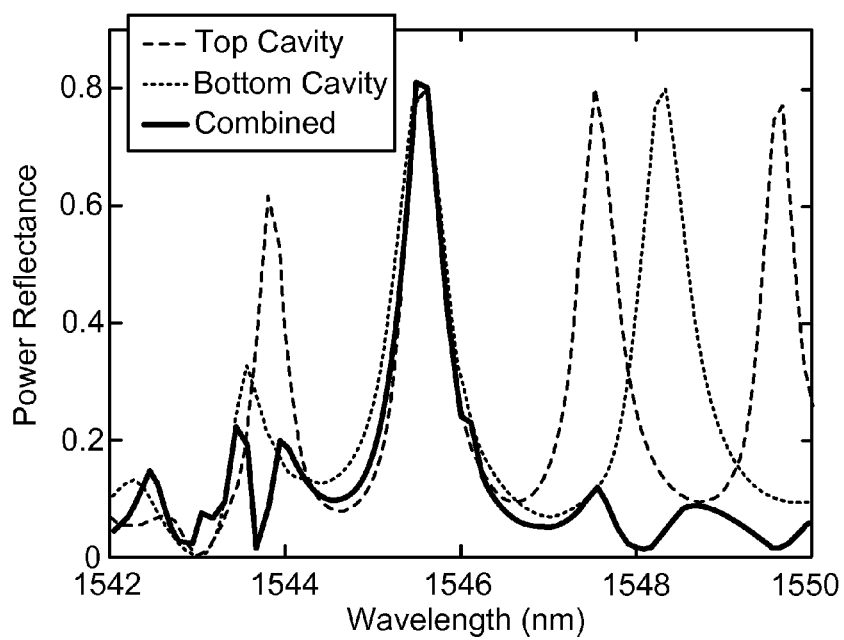
FIG. 4B is a plot showing reflectance spectra for individual and combined cavities as illustrated in FIG. 4A.

FIG. 4B is a plot showing reflectance spectra for individual and combined cavities as illustrated in FIG. 4A. As illustrated, each of the individual cavities is characterized by a multi-peak reflectance spectra. For example, the top cavity 420 includes peaks at ~1544 nm, 1545.5 nm, and 1547 nm. The bottom cavity 430 includes peaks at ~1545.5 nm and 1548 nm. The combined cavity includes a single reflectance peak at ~1545.5 nm.

Figure 4C:
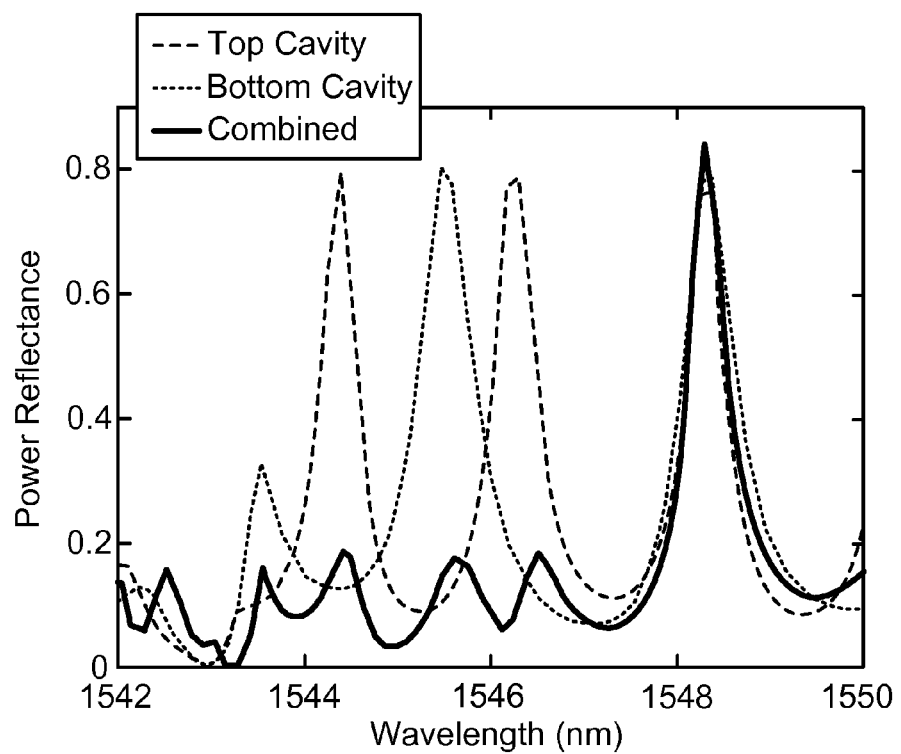
FIG. 4C is a plot showing reflectance spectra for individual and combined cavities with phase control according to an embodiment of the present invention.

Referring once again to FIG. 4A, phase control section 450 is provided in one of the cavities, in this case, in the waveguide of the top cavity 420. It should be noted that the phase control section could be disposed in the bottom cavity 430 or both cavities can implement phase control. FIG. 4C is a plot showing reflectance spectra for individual and combined cavities with phase control according to an embodiment of the present invention. By introducing a change in the refractive index of the top cavity equal to 0.1%, the peak of the combined cavity can be red-shifted by 2.5 nm, from ~1545.5 to ~1548 nm. Thus, tuning of the single reflectance peak is provided by the embodiment illustrated in FIG. 4A. This index change is exemplary and other suitable values can be utilized to obtain a desired wavelength shift. One of ordinary skill in the art would recognize many variations, modifications, and alternatives.

Although various embodiments of the present invention have been described in relation to FIG. 1A, FIG. 2A, FIG. 3A, and FIG. 4A, it will be appreciated that the elements utilized in the devices, including Y-junctions or directional couplers, can be interchanged, with optical elements from one embodiment utilized in place of optical elements described in relation to other embodiments. Additionally, as an example, Y-junctions or directional couplers could be alternatively replaced by MMIs. Thus, the optical elements, including Y-junction splitters, directional couplers, and MMIs, can appear in any combination in the configurations illustrated herein and used for both the first splitter and the coupling mechanisms to the cavities.

Figure 6:
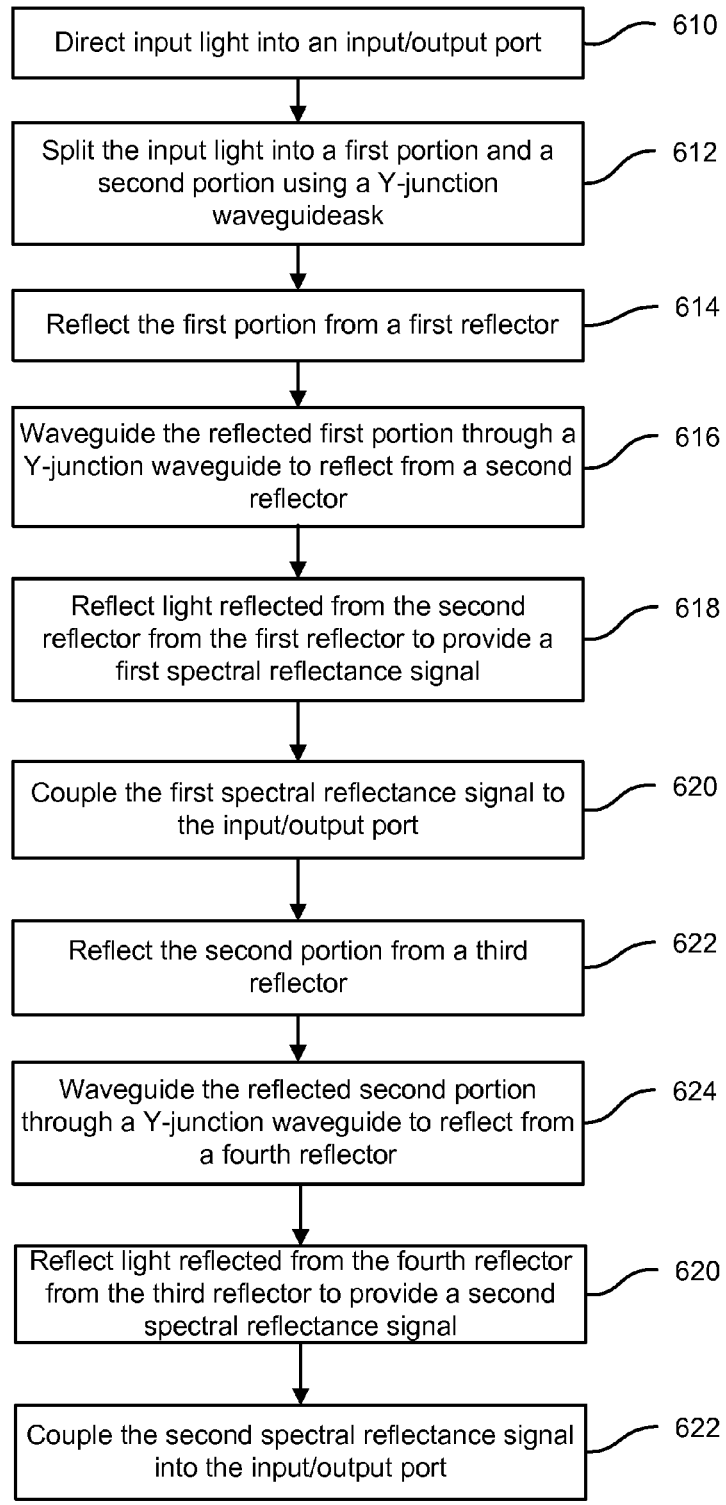
FIG. 6 is a simplified flowchart illustrating a method of providing variable spectral reflectance according to an embodiment of the present invention.

FIG. 6 is a simplified flowchart illustrating a method of providing variable spectral reflectance according to an embodiment of the present invention. The method includes inputting input light at an input/output port (610) and splitting the input light into a first portion and a second portion using a Y-junction waveguide (612). In an embodiment, the first portion passes through a region of variable index of refraction. As an example, a portion of the waveguide can include a phase control element such as a heater or a carrier-based (e.g., current injection) device that can vary the index of refraction of the waveguide, enabling the ability to control the reflectance spectrum of the device.

The method also includes reflecting the first portion from a first reflector (614), waveguiding the reflected first portion through a Y-junction waveguide to reflect from a second reflector (616) and reflecting light reflected from the second reflector from the first reflector to provide a first spectral reflectance signal (618). The method further includes coupling the first spectral reflectance signal to the input/output port (620), reflecting the second portion from a third reflector (622), and waveguiding the reflected second portion through a Y-junction waveguide to reflect from a fourth reflector (624). Additionally, the method includes reflecting light reflected from the fourth reflector from the third reflector to provide a second spectral reflectance signal (626) and coupling the second spectral reflectance signal to the input/output port (628). In an embodiment, the first spectral reflectance signal and the second spectral reflectance signal comprise a combined signal.

It will be appreciated that embodiments of the present invention provide resonant structures in which there are multiple cavities and, therefore, the nature of the resonant cavities involves a large number of reflections back and forth between the cavity mirrors depending on the cavity quality factors. Thus, the description provided herein in relation to light traveling along a given path is provided merely to illustrate device operation and should not limit the number or extent of propagation throughout the structures. Accordingly, the discussion of propagation of rays should be understood in the context of the cavities in which the rays are propagating.

It should be appreciated that the specific steps illustrated in FIG. 6 provide a particular method of operating a combined cavity according to an embodiment of the present invention. Other sequences of steps may also be performed according to alternative embodiments. For example, alternative embodiments of the present invention may perform the steps outlined above in a different order. Moreover, the individual steps illustrated in FIG. 6 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 7:
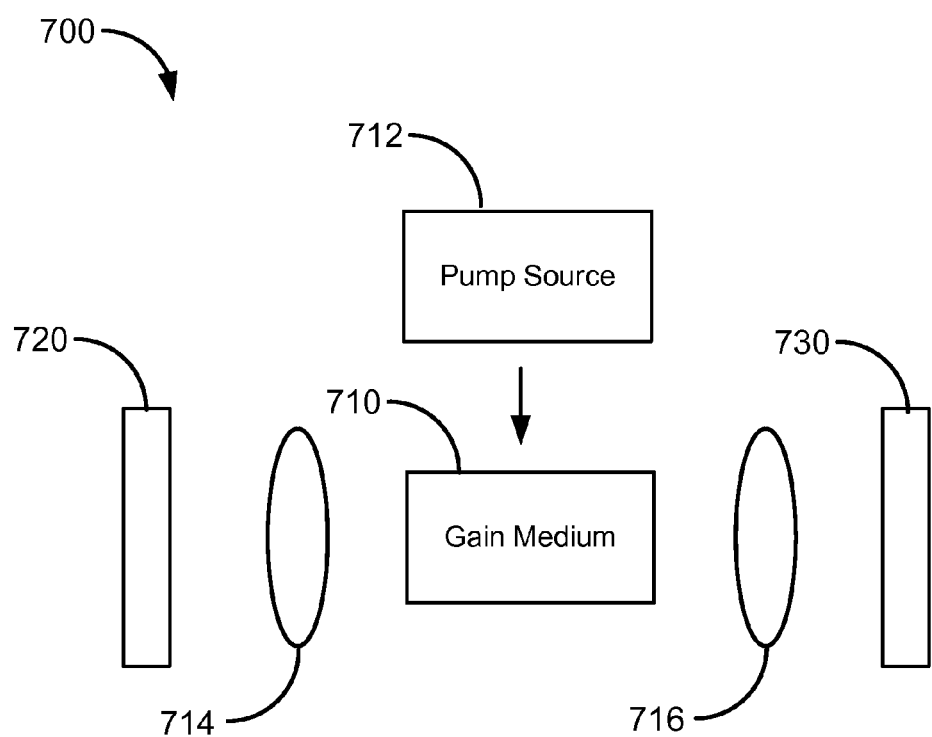
FIG. 7 is a simplified schematic diagram illustrating a laser incorporating reflective structures provided by embodiments of the present invention.

FIG. 7 is a simplified schematic diagram illustrating a laser 700 incorporating reflective structures provided by embodiments of the present invention. As illustrated in FIG. 7, a gain medium 710, pumped by a pump source 712, is disposed in a resonant cavity formed by reflectors 720 and 730. The pump source can be integrated with the gain medium in some embodiments, for example, as found in a semiconductor laser gain medium pumped by electrical current. The gain medium can provide a pulsed gain profile or a CW gain profile as appropriate to the particular application. Optical elements 714 and 716 are provided in the cavity to perform mode control and the like. In some embodiments, the optical elements can be discrete elements such as lenses or integrated elements such as waveguides. Thus, an integrated package for the laser 700 is included within the scope of the present invention.

Reflector 720 and/or reflector 730 can be implemented using any of the reflective structures discussed herein, including tunable reflective structure 100, tunable reflector 200, tunable reflector 300, or multi-cavity reflector 400. In a particular embodiment, the reflectors are implemented in an SOI wafer, with the gain medium integrated using a hybrid bonding process, thereby providing an integrated package for the laser 700. An alternative embodiment provides an amplifier (e.g., a double pass amplifier) in which one of the reflectors is removed to provide for a double pass through the gain medium. Additional applications include the use of the reflectors (which can provide a narrow band reflectance) in other optical devices including, without limitation, interferometers, spectrometers, or the like. One of ordinary skill in the art would recognize many variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A tunable reflector structure comprising:
an input/output port;
an optical splitter coupled to the input/output port;
a first resonant cavity coupled to a first output of the optical splitter;
a second resonant cavity coupled to a second output of the optical splitter;
wherein at least one of the first resonant cavity or the second resonant cavity include a phase control element and the first resonant cavity and the second resonant cavity form a loop with the optical splitter.

2. The tunable reflector structure of claim 1 wherein the first resonant cavity and the second resonant cavity share a common reflector.

3. The tunable reflector structure of claim 1 wherein the first resonant cavity and the second resonant cavity comprise sidewall modulated waveguide reflectors.

4. The tunable reflector structure of claim 1 wherein a cavity length of the first resonant cavity differs from a cavity length of the second resonant cavity.

5. The tunable reflector structure of claim 1 wherein the first resonant cavity and the second resonant cavity comprise Fabry-Perot cavities.

6. The tunable reflector structure of claim 1 wherein the optical splitter comprises a directional coupler.

* * * * *